United States Patent [19]

Krempl et al.

[11] Patent Number: 5,375,556
[45] Date of Patent: Dec. 27, 1994

[54] HYDROTHERMAL PROCESS FOR GROWING LARGE CRYSTALS OR CRYSTAL LAYERS

[75] Inventors: Peter W. Krempl, Graz/Ragnitz; Gabriele Voborsky, Graz; Uwe Posch, Graz; Wolfgang Wallnöfer, Graz, all of Austria

[73] Assignee: AVL Gesellschaft fur Verbrennungskraftmaschinen und Messtechnik m.b.H., Graz, Austria

[21] Appl. No.: 110,781

[22] Filed: Aug. 23, 1993

[30] Foreign Application Priority Data

Sep. 4, 1992 [AT] Austria .................................. 1780/92

[51] Int. Cl.$^5$ ................................................. C30B 7/10
[52] U.S. Cl. ..................................... 117/71; 117/224; 117/941
[58] Field of Search ........................... 117/71, 224, 941

[56] References Cited

U.S. PATENT DOCUMENTS

| | | | |
|---|---|---|---|
| 4,300,979 | 11/1981 | Kolb et al. | 117/71 |
| 4,382,840 | 5/1983 | Chai et al. | 117/71 |
| 4,481,069 | 11/1984 | Chai et al. | 117/71 |
| 4,578,146 | 3/1986 | Chai | 117/71 |
| 4,579,622 | 4/1986 | Caporaso et al. | 117/71 |
| 4,678,535 | 7/1987 | Mang et al. | 117/71 |
| 4,946,545 | 8/1990 | Engel et al. | 117/71 |

FOREIGN PATENT DOCUMENTS 54-69595  6/1979  Japan .................................. 117/71

*Primary Examiner*—Robert Kunemund
*Attorney, Agent, or Firm*—Watson, Cole, Grindle & Watson

[57] ABSTRACT

In order to obtain large, high-quality crystals or crystal layers of a metal orthophosphate, in particular, $GaPO_4$ or $AlPO_4$, from a nutrient solution with the use of a seed plate, the proposal is put forward that in the initial phase of the growth process a seed plate of alpha-quartz ($\alpha$-$SiO_2$) be introduced into the nutrient solution, and that fluoride ions ($F^-$) be added to this solution, at least for formation of the primary crystal layer on the quartz seed plate.

11 Claims, 1 Drawing Sheet

HYDROTHERMAL PROCESS FOR GROWING LARGE CRYSTALS OR CRYSTAL LAYERS

BACKGROUND OF THE INVENTION

The invention relates to a hydrothermal process for growing large crystals or crystal layers of a metal orthophosphate, in particular gallium phosphate ($GaPO_4$) or aluminum phosphate ($AlPO_4$), from a nutrient solution with the use of a seed plate.

DESCRIPTION OF THE PRIOR ART

On account of their special properties, which are superior to those of quartz in many applications (for example, improved high-temperature behavior), single crystals of certain metal orthophosphates, such as $GaPO_4$ or $AlPO_4$ (also called berlinite), have attracted increased attention over the last few years, in particular as piezoelectric crystals, and great efforts are being made to produce these crystals in such amounts and sizes as to permit their use in industrial applications. The chief problem in producing these crystals is the lack of naturally grown crystals from which—as in the instance of quartz—large seed plates of high quality could be gained, which are used for crystal growing i.e., mainly with hydrothermal methods. When crystals are derived from the melt (CZOCHRALSKY process) these metal orthophosphates do not exhibit the desired crystal structure with point group 32.

The gradual growth of metal orthophosphate crystals from small spontaneous crystals has its own problems on account of the tendency towards twinning at the growing site, in addition to being a very slow process with poor changes of success. For this reason special methods have been investigated in order to obtain seed plates of satisfactory size. U.S. Pat. No. 4,578,146, for instance, discloses a method of producing large seed plates by growing crystals from small seed plates aligned side by side. Although this method will considerably accelerate the production of large seed plates, it can only be employed if synthetically grown metal orthophosphate crystals are available.

SUMMARY OF THE INVENTION

It is an object of the invention to propose a method which will permit the growing of large metal orthophosphate crystals of a high quality.

In the invention this object is achieved by providing that a seed plate of alpha-quartz ($\alpha$-$SiO_2$) be introduced into the nutrient solution in the initial phase of the growth process, and that fluoride ions ($F^-$) be added to the nutrient solution, at least for formation of the primary crystal layer on the quartz seed plate, alpha-quartz being a quartz modification crystallizing in point group 32, which is stable up to 573° C.

It has been found unexpectedly that contrary to previous views seed plates of alpha-quartz are suitable for growing crystals of metal orthophosphates, if small amounts of fluoride ions are added to the nutrient solution. As quartz seed plates are available in many shapes and sizes at comparatively low expense, large orthophosphate crystals of a high quality may be produced with the new method in a simple manner.

The underlying principle of the process is thought to be as follows. By addition fluoride ions to the nutrient solution monocrystalline layers of metal orthophosphate apparently are induced to grow on certain surfaces of alpha-quartz.

In a first variant of the invention the growth process is continued until a metal orthophosphate crystal of the desired shape and size has formed in the nutrient solution enriched with fluoride ions.

In a second variant crystal growth is stopped once an epitaxial layer of metal orthophosphate has been deposited on the seed plate, and the seed plate coated with this layer of metal orthophosphate is used as a seed plate with some other known method for growing metal orthophosphate crystals. This type of process essentially comprises two steps:
(1) epitaxy on quartz,
(2) completing growth of the single crystal region by means of some other technique.

In the invention the fluoride ions are added to the nutrient solution in the form of 0.01 to 10 percent by weight ammonium fluoride ($NH_4F$) or ammonium hydrogen difluoride (($NH_4(HF_2)$)). It is also possible to add the fluoride ions to the nutrient solution in the form of hydrofluoric acid (HF), or as lithium-, sodium-, or potassium fluoride (LiF, NaF, or KF).

A special advantage is gained by implementing the new method as a hydrothermal process, where the crystals are grown in sealed vessels at elevated pressures and temperatures.

In particular, the invention provides that a nutrient solution of 2 to 15M phosphoric acid ($H_3PO_4$) supersatured in the metal orthophosphate be used, and that crystal growth take place at temperatures exceeding 150° C., preferably 180° to 240° C.

In a preferred variant seed plates of alpha-quartz are used whose largest face is essentially perpendicular to the optical axis (Z-or C-axis) of the quartz plate.

High-quality crystal growth is obtained on quartz faces that are perpendicular to the optical axis of the quartz crystal, i.e., on the so-called Z-faces. But also X-faces, i.e. faces perpendicular to the electric axis (X-axis) of the quartz crystal, are suitable for growing metal orthophosphates on quartz in the above nutrient solution.

Although the most important advantage of the method of the invention is the possibility of using quartz seed plates, the increased growth rates accompanied by an improved crystal quality also are noteworthy. The crystal material grown on quartz, e.g. of gallium phosphate ($GaPO_4$), has unexpectedly proved free of twins, a rare phenomenon in spontaneous $GAPO_4$ crystals, and even rare in Ga-orthophosphate crystals grown on $GAPO_4$ seed plates. This contradicts the general assumption that monocrystalline material is more perfect if grown on seed plates of the same material.

Avoiding the quartz seed plate, metal orthophosphate seed plates may be cut from the metal orthophosphate crystal, which may be used together with any other known technique of growing metal orthophosphate crystals.

The major advantage in this context is that seed plates are cut from the metal orthophosphate crystals, whose largest face is essentially perpendicular to the electric axis (X-axis) of the metal orthophosphate crystal.

For special purposes demanding a very low density of dislocations in the single crystal region the following two-step procedure is recommended;

Step 1—deposition of a primary crystal layer of the metal orthophosphate on the quartz seed plate with the addition of fluoride ions, and further growth in the same or some other medium.

Step 2—From the crystals obtained in this manner X-plates are cut, i.e., seed plates whose major face is perpendicular to the electric axis (X-axis), from which the ultimate crystals designed for practical use are grown in a suitable medium (for example, a sulphuric acid solution ($H_2SO_4$) supersaturated in the metal orthophosphate, or a supersaturated mixed solution of phosphoric ($H_3PO_4$) and sulphuric ($H_2SO_4$) acid). As the part growing on the X-face is characterized by a particularly low density of dislocations, the above demand for low dislocation density in this crystal region is satisfied.

BRIEF DESCRIPTION OF THE DRAWINGS

Following is a description of the invention with reference to the accompanying drawings, in which.

DESCRIPTION OF THE DRAWINGS

Figure 2:
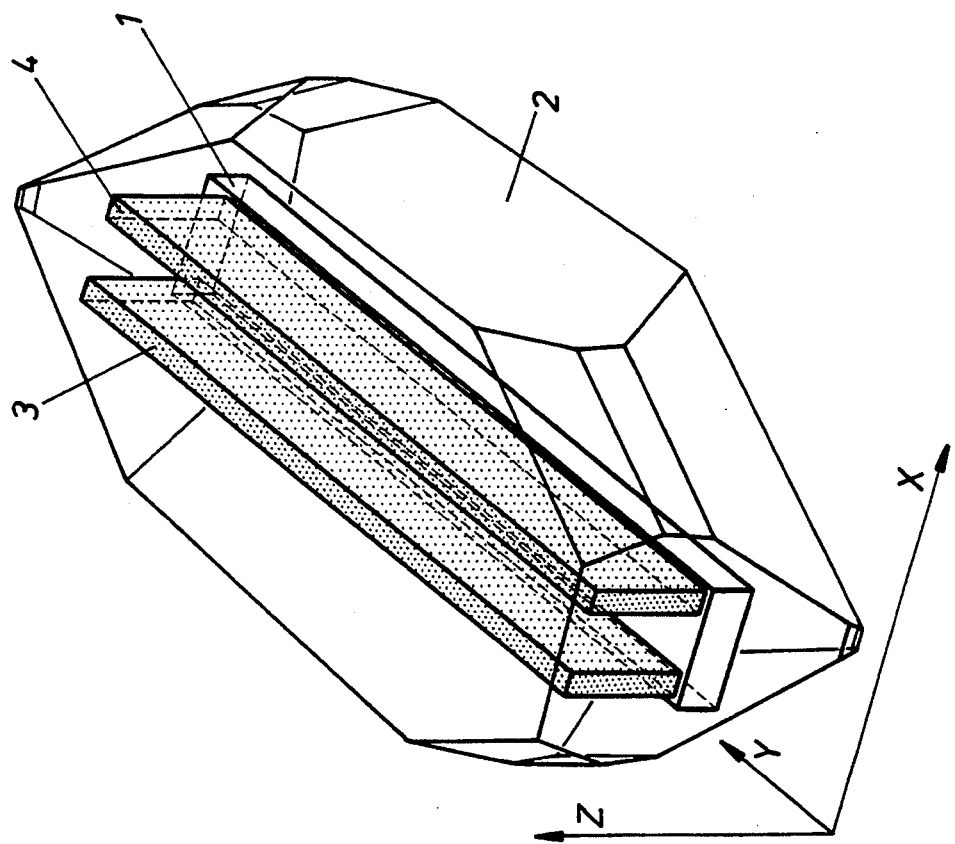
FIGS. 1 and 2 show crystals of metal orthophosphate obtained with the process described by the invention.
Figure 1:
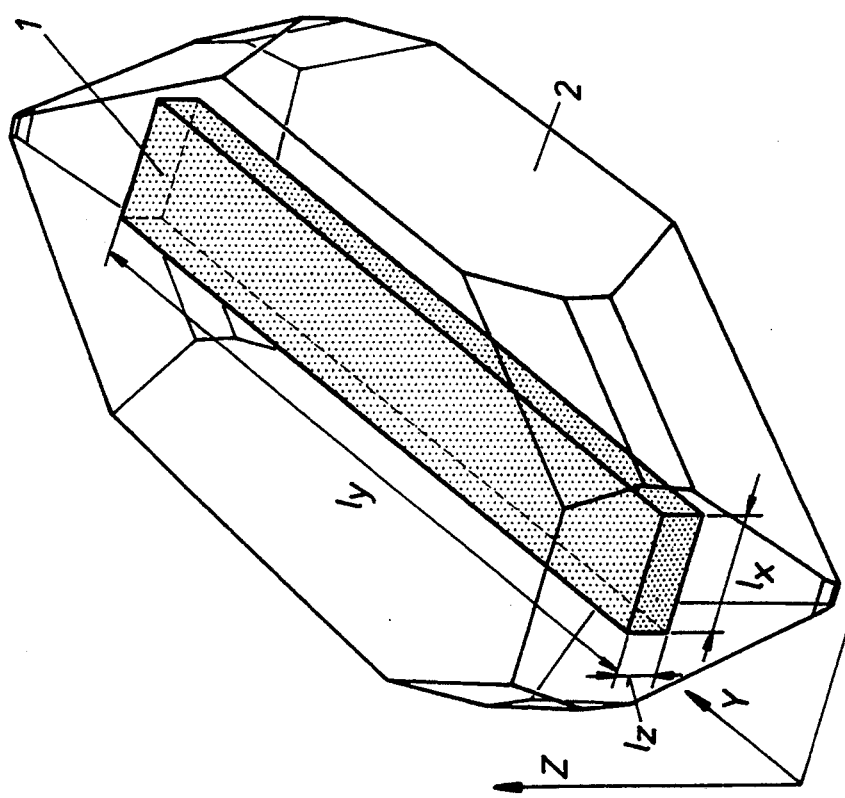

FIG. 1 shows a typical rectangular seed plate 1 of quartz, with length relations 1y>1x>1z, and the metal orthophosphate crystal 2 grown on it, in the coordinate system X,Y,Z relative to which the crystal axes are defined. FIG. 2 also shows the seed plate 1 of quartz and the grown crystal 2 of metal orthophosphate. Numbers 3 and 4 refer to the X-seed plates which may be derived therefrom and are used for growing special metal orthophosphate crystals free of dislocations.

Example for preparation of a single crystal of gallium phosphate.

By dissolving 7 percent by weight gallium phosphate ($GaGO_4$) and approx. 1 percent by weight ammonium fluoride ($NH_4F$) in phosphoric acid ($H_3PO_4$) of a molarity of about 12M, and by introducing a seed plate of alpha-quartz into this solution and raising the temperature to more than 150° C., i.e., to 180° or 240° C., a $GaPO_4$ single crystal is obtained after several days, growing on the seed plate at a growth rate of about 0.2 mm/day in the Z-direction.

We claim:

1. A hydrothermal process for growing large crystals and crystal layers of a metal orthophosphate from a nutrient solution using a seed plate comprising the steps of:
   a) introducing a seed plate of alphaquartz ($\alpha$-$SiO_2$) into said nutrient solution in an initial phase of said growing process, and
   b) adding fluoride ions ($F^-$) to said nutrient solution, at least for formation of a primary crystal layer on said quartz seed plate.

2. A process according to claim 1, wherein 0.01 to 10 percent by weight ammonium fluoride ($NH_4F$) is added to said nutrient solution in step a).

3. A process according to claim 1, wherein 0.01 to 10 percent by weight ammonium hydrogen difluoride (($NH_4$)$HF_2$) is added to said nutrient solution in step a).

4. A process according to claim 1, wherein in step a) at least one substance selected from the group consisting of hydrofluoric acid (HF), lithium-, sodium-, and potassium fluoride (LiF, NaF, and KF) is added.

5. A process according to claim 1, wherein said nutrient solution comprises 2 of 15M phosphoric acid ($H_3PO_4$) supersaturated with metal orthophosphate, and including heating the nutrient solution to a temperature exceeding 150° C.

6. A process according to claim 5, wherein said temperature is between 180° and 240° C.

7. A process according to claim 1, wherein crystal growth is continued until a metal orthophosphate crystal of desired shape and size has formed in said nutrient solution enriched with said fluoride ions.

8. A process according to claim 1, wherein crystal growth is stopped once an epitaxial layer of metal orthophosphate has been deposited on said seed plate, and wherein said seed plate coated with said epitaxial layer of metal orthophosphate is used as a seed plate in a different growth process for growing metal orthophosphate crystals.

9. A process according to claim 1, wherein said seed plate has a largest face which is essentially perpendicular to the optical axis (Z- or C-axis) of said quartz plate.

10. A process according to claim 1, wherein said metal orthophosphate is gallium phosphate ($GaPO_4$).

11. A process according to claim 1, wherein said metal orthophosphate is aluminum phosphate ($AlPO_4$).

* * * * *

UNITED STATES PATENT AND TRADEMARK OFFICE
CERTIFICATE OF CORRECTION

PATENT NO. : 5,375,556

DATED : December 27, 1994

INVENTOR(S) : Peter W. Krempl et al

It is certified that error appears in the above-indentified patent and that said Letters Patent is hereby corrected as shown below:

On the title page, item [73] should read as follows:

--[73] Assignee: AVL Gesellschaft für
Verbrennungskraftmaschinen und Messtechnik
M.b.H., Prof. Dr.Dr.H.C. Hans List,
Graz, Austria--.

Signed and Sealed this

Fourteenth Day of February, 1995

Attest:

BRUCE LEHMAN

*Attesting Officer*     *Commissioner of Patents and Trademarks*